United States Patent [19]

Powell

[11] Patent Number: 5,949,557
[45] Date of Patent: Sep. 7, 1999

[54] TOTAL INTERNAL REFLECTION HOLOGRAPHY METHOD AND APPARATUS FOR LITHOGRAPHY ON 3-D SPHERICAL SHAPED INTEGRATED CIRCUIT

[75] Inventor: Karlton Powell, Richland Hills, Tex.

[73] Assignee: Ball Semiconductor, Inc., Allen, Tex.

[21] Appl. No.: 09/094,761

[22] Filed: Jun. 15, 1998

[51] Int. Cl.[6] .................................................. G03H 1/02
[52] U.S. Cl. .................................................. 359/8; 359/28
[58] Field of Search .................................. 359/28, 30, 31, 359/23, 12, 15, 8, 2

[56] References Cited

U.S. PATENT DOCUMENTS

| | | | |
|---|---|---|---|
| 4,339,168 | 7/1982 | Haines | 350/8 |
| 4,966,428 | 10/1990 | Phillips | 350/12 |
| 5,640,257 | 6/1997 | Clube | 350/30 |

*Primary Examiner*—Cassandra Spyrou
*Assistant Examiner*—Fayez Assaf
*Attorney, Agent, or Firm*—Haynes and Boone, L.L.P.

[57] ABSTRACT

A photolithograhic method and apparatus for exposure of a spherical shaped semiconductor substrate according to a mask pattern of a primary spherical object mask in the manufacture of a spherical semiconductor device is disclosed. A secondary mask is provided, the secondary mask having stored therein a hologram recorded from the primary spherical object mask and containing spherical mask pattern information. The spherical shaped semiconductor substrate is then positioned with respect to the secondary mask in preparation for a photolithographic exposure. Lastly, a reference beam is directed upon the secondary mask for enabling inverse scattering of the hologram to produce an inverse scattered holographic image photolithographic exposure of the spherical shaped semiconductor substrate.

50 Claims, 6 Drawing Sheets

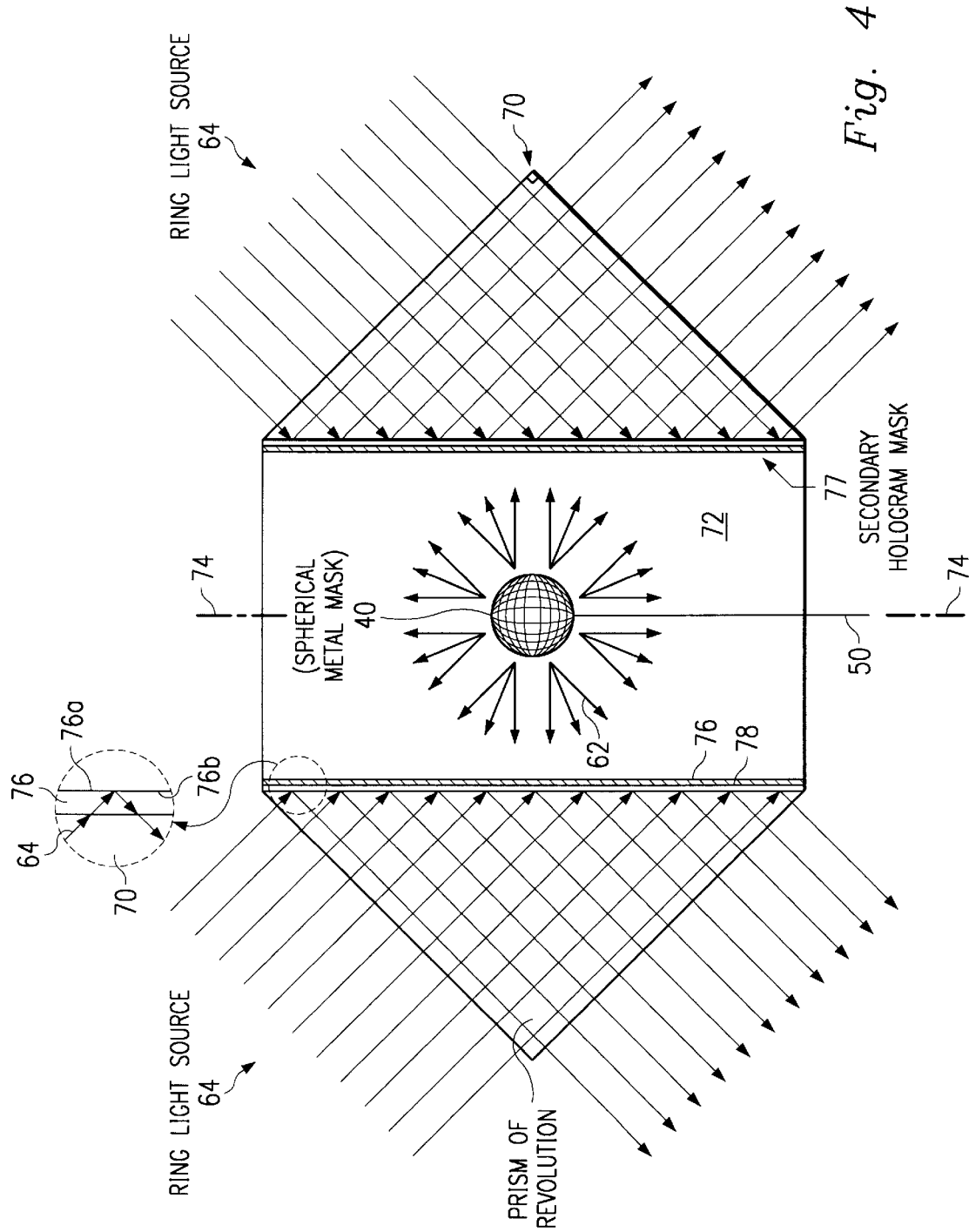

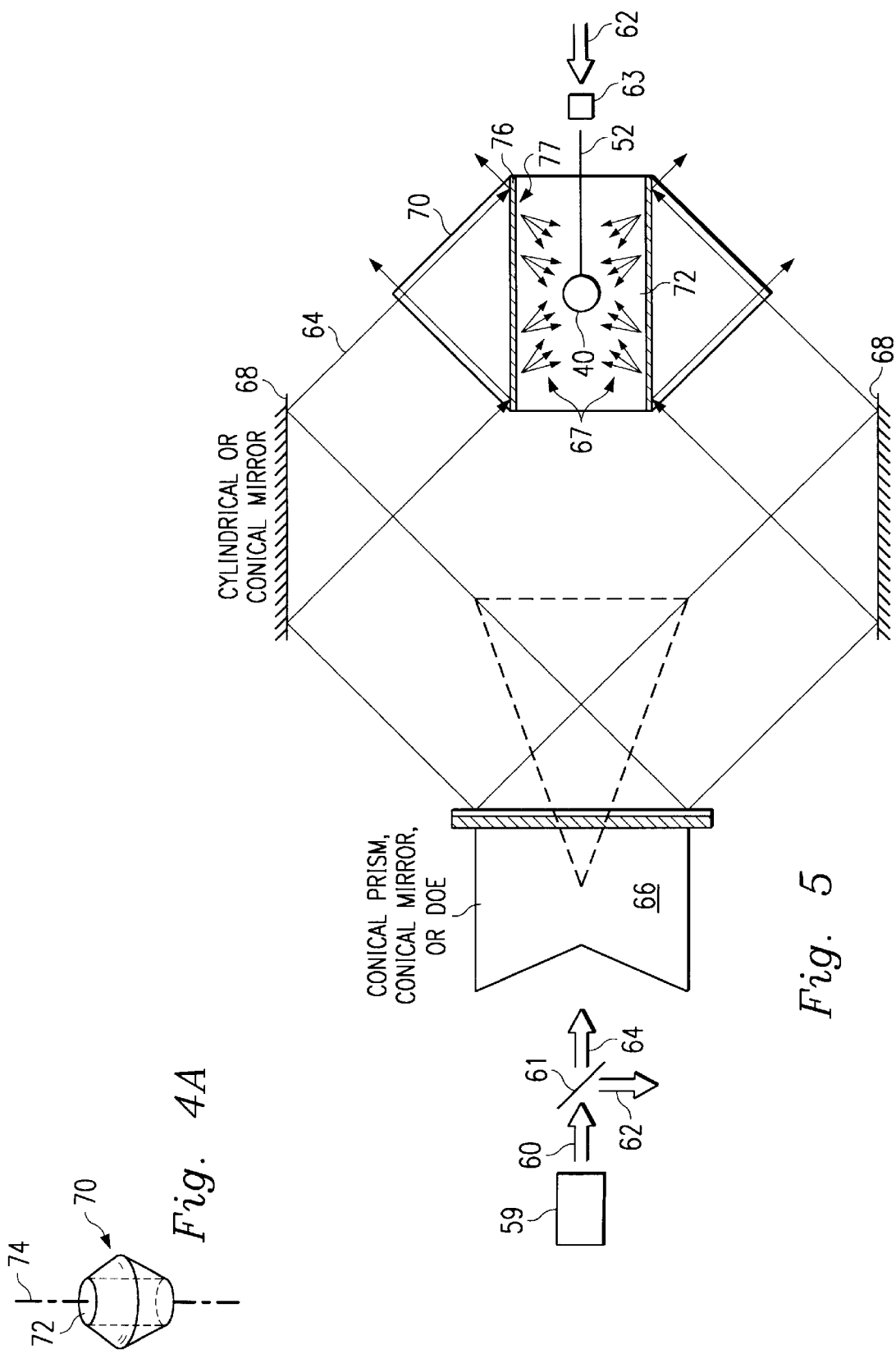

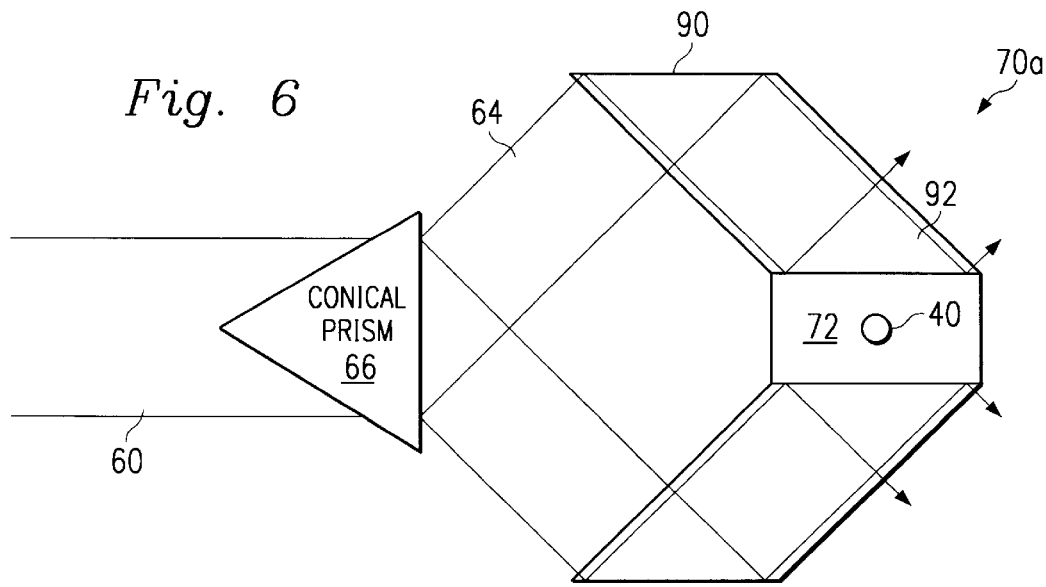
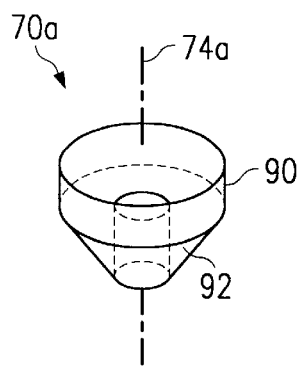
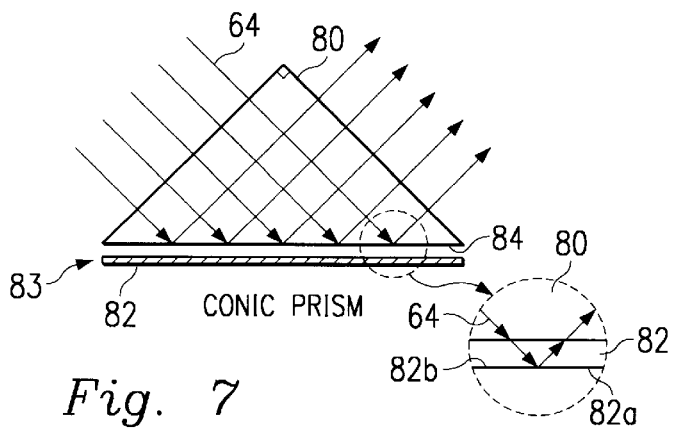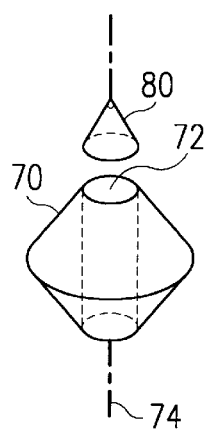

TOTAL INTERNAL REFLECTION HOLOGRAPHY METHOD AND APPARATUS FOR LITHOGRAPHY ON 3-D SPHERICAL SHAPED INTEGRATED CIRCUIT

BACKGROUND OF THE INVENTION

1. Field of the Invention

The present invention relates generally to semiconductor integrated circuits, and more particularly, to a spherical shaped semiconductor integrated circuit and the use of TIR holography in a system and method for use in manufacturing the same.

2. Discussion of the Related Art

Total internal reflection (TIR) holograms are constructed from expanded laser beams, as is known in the art. Referring now to FIG. 1, consider for example, a holographic recording layer 10 is disposed on a transparent flat substrate 12. Substrate 12 is in optical contact with a large right angle prism 14. With the use of expanded laser beams 16, 18 as shown in FIG. 1, TIR holograms can be constructed. One beam, referred to as the object beam 16, is directed through a mask transparency 20 to the holographic recording layer 10. The other beam, referred to as the reference beam 18, is directed through another face of the prism 14 so that it is totally reflected from the internal surface 22 of the holographic recording layer 10. The optical interference of the two beams 16, 18 is recorded by the holographic recording layer's photosensitive material. Subsequent to exposure, the holographic recording layer 10 is developed and fixed according to the particular processing steps required for the holographic recording layer. Once developed and fixed, the hologram stored in the holographic recording layer 10 can be reconstructed by irradiating it with a laser beam directed in the opposite direction to the original reference beam 18.

U.S. Pat. No. 5,640,257 discloses an apparatus and method for the manufacture of high uniformity 2-dimensional total-internal-reflection (TIR) holograms. In the '257 patent, the manufacture of TIR holograms includes the division of an input laser beam into an object beam and a reference beam. The direction of the beams to a holographic recording layer is adjusted a) so that the object beam is incident on a surface of the holographic recording layer following transmission through an object mask and b) so that the reference beam is incident on the other surface of the holographic recording layer. The reference beam is directed at an angle such that following passage through the holographic recording layer, the reference beam is totally internally reflected back into the holographic recording layer. The object beam and the reference beam are superposed at the holographic recording layer. Displacement of the input beam causes the object and reference beams to traverse together along the holographic recording layer. The '257 method and apparatus, however, is only applicable for 2-dimensional, flat lithography.

Hologram formation is sensitive to mechanical and other instabilities. A hologram is a recording of an optical interference pattern. A hologram will only be formed successfully if at each point on the recording surface the relative phases of the interfering object and reference beams are substantially constant during the exposure process.

SUMMARY OF THE INVENTION

According to one embodiment, a method for recording a total internal reflection hologram of a spherical shaped object mask in a holographic recording medium includes the steps of: (i) providing a coherent beam of light, wherein the coherent beam of light is further for providing an object beam and a reference beam, (ii) providing a primary holographic optical waveguide characterized by an inner cylindrical cavity disposed therein, the inner cylindrical cavity being concentric with a principal axis of the primary holographic optical waveguide, wherein the holographic recording medium is optically coupled to the inner surface of the cylindrical cavity, (iii) directing the object beam to the holographic recording medium so that the object beam is incident on an exposure surface on a first side of the holographic recording medium following transmission through the spherical shaped object mask, and (iv) directing the reference beam through the primary holographic optical waveguide at an angle to enable total internal reflection of the reference beam on an internal surface on the first side of the holographic recording medium, wherein the object beam and the reference beam produce an interference pattern in the holographic recording medium in accordance with a spherical mask pattern contained in the spherical shaped object mask.

In accordance with another embodiment, a method for recording a total internal reflection hologram of a spherical shaped object mask in a holographic recording medium includes the following steps. A coherent beam of light is provided, the coherent beam of light further for providing an object beam and a reference beam. Next, a primary holographic optical waveguide characterized by a right angle prism is provided, the right angle prism having the holographic recording medium optically coupled to a base surface thereof. The object beam is directed to the holographic recording medium so that the object beam is incident on an exposure surface on a first side of the holographic recording medium following transmission through the spherical shaped object mask. Lastly, the reference beam is directed through the primary holographic optical waveguide at an angle to enable total internal reflection of the reference beam on an internal surface on the first side of the holographic recording medium. As a result, the object beam and the reference beam produce an interference pattern in the holographic recording medium in accordance with a spherical mask pattern contained in the spherical shaped object mask.

Still further, in accordance with yet another embodiment, a photolithograhic method for exposure of a spherical shaped semiconductor substrate according to a mask pattern of a primary spherical object mask in the manufacture of a spherical semiconductor device includes the following steps. A secondary mask is provided, the secondary mask having stored therein a hologram recorded from the primary spherical object mask and containing spherical mask pattern information. The spherical shaped semiconductor substrate is positioned with respect to the secondary mask in preparation for a photolithographic exposure. Lastly, a reference beam is directed upon the secondary mask for enabling inverse scattering of the hologram to produce an inverse scattered holographic image photolithographic exposure of the spherical shaped semiconductor substrate.

Yet still further, other alternate embodiments are disclosed herein which include apparatus for recording a total internal reflection hologram of a spherical shaped object mask in a holographic recording medium of a secondary mask. In addition, a TIR photolithograhic apparatus for exposure of a spherical shaped semiconductor substrate according to a mask pattern of a primary spherical object mask in the manufacture of a spherical semiconductor device is disclosed.

BRIEF DESCRIPTION OF THE DRAWINGS

The foregoing and other teachings and advantages of the present invention will become more apparent upon a detailed description of the best mode for carrying out the invention as rendered below. In the description to follow, reference will be made to the accompanying drawings, in which:

FIG. 4 illustrates, in cross-section, one embodiment of a primary holographic optical waveguide in the form of a prism of revolution for use in accordance with the holographic lithography method and apparatus of the present disclosure and FIG. 4A shows a 3-D isometric view of the prism of revolution of FIG. 4;

FIG. 5 illustrates an exposure system for use during creation of a secondary holographic mask and during exposure of a spherical semiconductor according to the method and apparatus of the present disclosure;

FIG. 6 illustrates an exposure system having an alternate total internal reflection waveguide or optical element for use with the method and apparatus of the present disclosure and FIG. 6A illustrates a 3-D isometric view of the waveguide of FIG. 6;

FIG. 7 illustrates in cross-section a conical shaped right-angle prism for use in yet another alternate embodiment and FIG. 7A illustrates a 3-D isometric view of the conical prism of FIG. 7 in conjunction with the prism of revolution of FIG. 4.

DETAILED DESCRIPTION OF THE PREFERRED EMBODIMENTS

Figure 1:
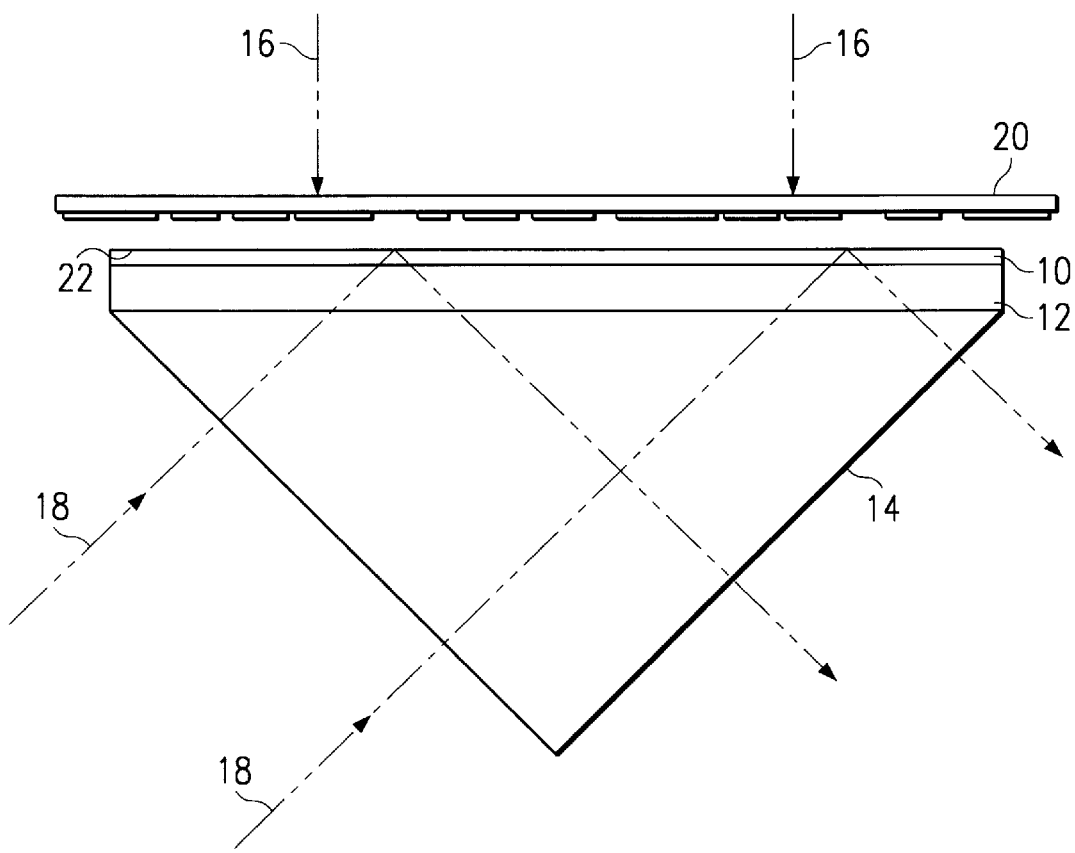
FIG. 1 illustrates main principals of TIR holography.
Figure 2:
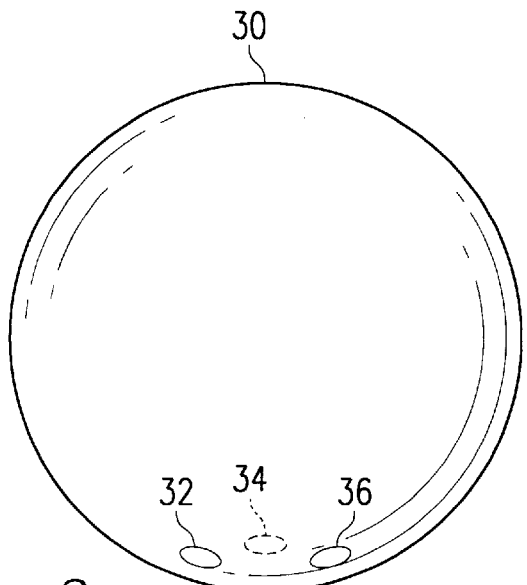
FIG. 2 shows an exemplary spherical shaped semiconductor substrate, also referred to herein as a spherical semiconductor substrate.

Referring now to FIG. 2, a spherical shaped semiconductor substrate 30 is shown. The spherical substrate 30 preferably includes suitable alignment marks, the alignment marks for use during processing of the spherical substrate, further wherein a particular positioning of the semiconductor substrate is necessary. For example, alignment marks 32, 34, and 36 can be provided, wherein the marks are not equally spaced apart. Such an arrangement of non-equidistant alignment marks provides a particular alignment orientation to facilitate obtaining a correct alignment of the spherical substrate 30, (i.e., placed in a prescribed position) as may be required for a particular semiconductor processing step. The alignment marks may be formed any number of ways. For instance, the alignment marks may be formed as physical markings, indentations, or the like. Alternatively, the alignment marks may be formed during an initial photolithographic processing operation, wherein the alignment marks can be used for defining a particular alignment as may be necessary for subsequent processing steps. In addition, the alignment marks may also be formed so as not to disrupt the shape of the sphere itself, i.e., at the surface thereof.

Spherical semiconductor substrate 30 is formed such as disclosed in co-pending application, Ser. No. 08/858,004, filed May 16, 1997, entitled "Spherical Shaped Semiconductor Integrated Circuit", further incorporated herein by reference. Prior to a photolithography step, spherical substrate 30 is coated with one or more desired layers to be patterned, to include a photoresist layer. Such layers to be patterned can include conductive and/or insulative layers. With a suitable photoresist layer thereon, spherical substrate 30 is ready for an exposure step using the method of TIR holography for lithography on a spherical substrate as discussed further herein below.

Figure 3:
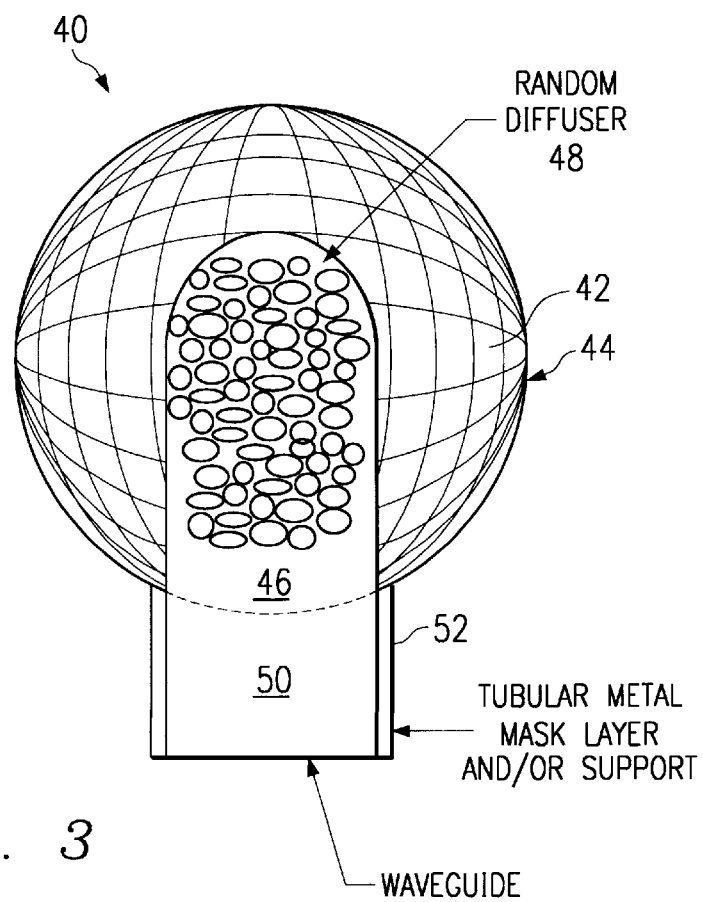
FIG. 3 illustrates, in partial cross-section, an exemplary primary mask, illuminated via a random diffuser, for use in the holographic lithography method and apparatus of the present disclosure.

The method and apparatus for recording a total internal reflection hologram of a spherical shaped object mask in a holographic recording medium shall now be discussed beginning with reference to FIG. 3. FIG. 3 illustrates an exemplary primary mask 40, alternatively referred to as the spherical object mask, which is used in conjunction with the recording of the TIR hologram. In one embodiment, the primary mask 40 is dimensioned on the order of the spherical substrate 30 of FIG. 2. Alternate size ratios between primary mask 40 and spherical substrate 30 are also contemplated.

Primary mask 40 includes a spherical core 42 made up of a transparent material. Such a transparent material may include glass or other suitable material. A pattern 44 is disposed upon an outer surface of the spherical core 42. Pattern 44 includes a desired mask pattern to be replicated upon spherical substrate 30 during photolithography processing of spherical substrate 30 according to the method and apparatus discussed herein.

Referring still to FIG. 3, spherical core 42 includes a blind hole or blind aperture 46 formed therein. Blind hole 46 includes a random diffuser 48. In addition, a waveguide 50 and an optional tubular support 52 are provided, as shown. Waveguide 50 facilitates passage of an object beam into an inner or center region of spherical object mask 40. Waveguide 50 further provides physical support to the spherical object mask 40, in particular, for use in positioning mask 40 in a desired position, as will be discussed further herein. In addition, the optional tubular support 52 may also be used as needed for providing physical support to the object mask 40. Support 52 can include metal or other suitable material, such as the mask layer which is deposited upon core 42 in the fabrication of mask 40.

Referring now to FIGS. 4 and 5, a coherent beam of light 60 is provided by a coherent light source 59, for example, a suitable laser device or the like. The coherent beam of light 60 is used for providing an object beam 62 and a reference beam 64. With the use of suitable optical beamsplitters, mirrors, etc. the object beam and reference beam are obtained from the coherent beam of light 60. For instance a beamsplitter 61 and an optical coupler 63 can be used to provide the object beam 62 to the spherical shaped object mask 40. In addition, suitable optical elements 66, 68 are used for providing reference beam 64 to a primary holographic optical waveguide 70. For example, optical element 66 may include a conical prism, conical mirror, or diffractive optical element (DOE), or the like for transforming the reference beam into a ring shaped reference beam.

As shown in FIGS. 4 and 5, the TIR method and apparatus for lithography on a spherical substrate further includes a primary holographic optical waveguide 70. The primary holographic optical waveguide 70 is characterized by an inner cylindrical cavity 72 disposed therein (FIGS. 4, 4A). The inner cylindrical cavity 72 is concentric with a principal axis 74 of the primary holographic optical waveguide 70. A holographic recording medium 76 is disposed upon and/or optically coupled to the inner surface 78 of the cylindrical cavity 72. In one embodiment, the primary holographic optical waveguide 70 includes a right angle prism of revolution as is shown in FIG. 4. FIG. 4A illustrates a 3-D isometric view of the prism of revolution.

With respect to the object beam, object beam 62 is directed to the holographic recording medium 76 in a manner such that the object beam 62 is incident on an exposure surface 76a on a first side of the holographic recording medium 76. Prior to being incident upon the exposure surface 76a of the holographic recording medium 76, the object beam 62 is transmitted through the spherical shaped object mask 40. Lastly, the reference beam 64 is directed through the primary holographic optical waveguide 70 in a manner such that the reference beam 64 is disposed at an angle to enable total internal reflection of the reference beam on an internal surface 76b on the first side of the holographic recording medium 76. Together, the object beam and the reference beam produce an interference pattern in the holographic recording medium 76 in accordance with a pattern contained in the spherical shaped object mask 40, further as defined by the particular mask pattern 44.

Figure 8:
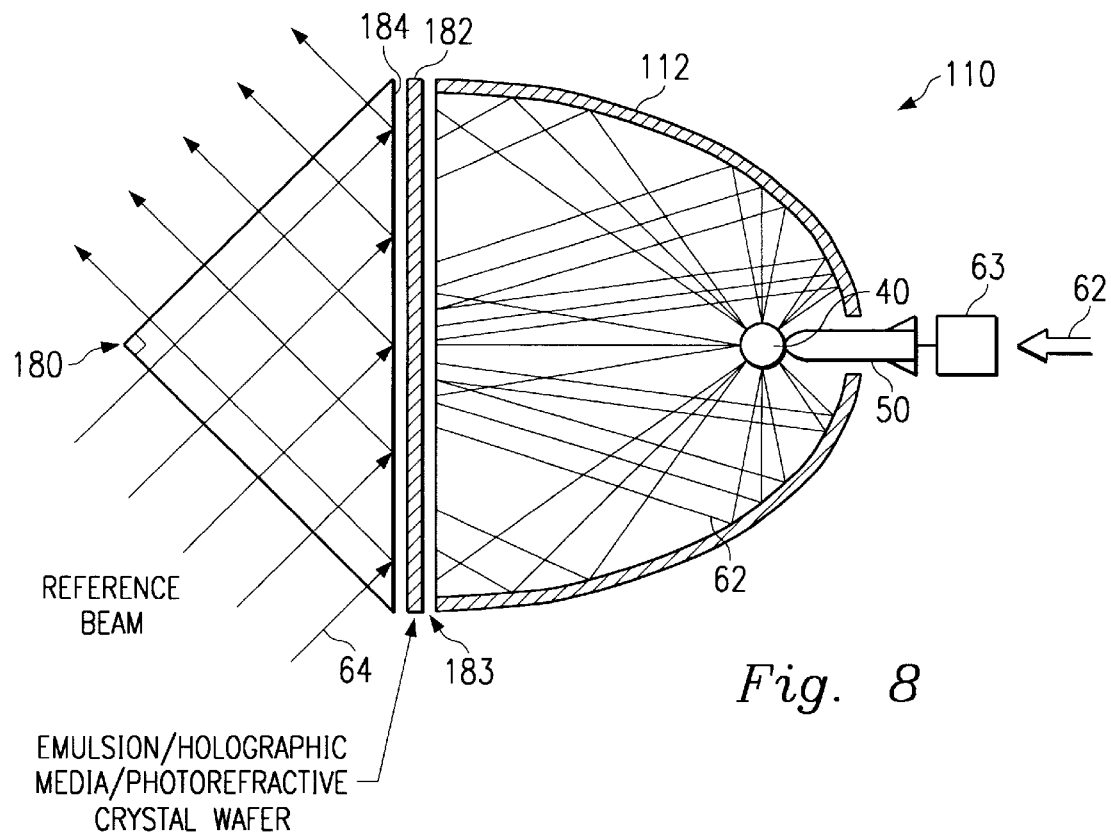
FIG. 8 shows, in cross-section, yet another alternate embodiment of the holographic lithography method and apparatus of the present disclosure
Figure 8A:
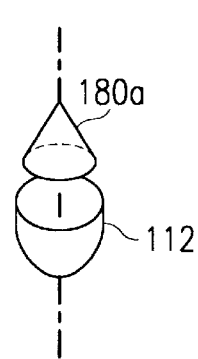
FIGS. 8A and 8B illustrate exemplary isometric views of the waveguide and mirror of FIG. 8.

The method and apparatus of the present embodiment further includes providing, an auxiliary holographic optical waveguide 80 in the form of a conical shaped right-angle prism. Such a conical shaped right-angle prism is shown in FIG. 8. FIG. 8A illustrates a 3-D isometric view of the conical shaped right-angle prism 80. The conical shaped prism includes a second holographic recording medium 82 disposed on and/or optically coupled to a base surface 84 thereof. In use, the auxiliary holographic optical waveguide 80 is positioned with respect to the primary holographic optical waveguide 70 such that the second holographic recording medium 82 is disposed at one end of the cylindrical cavity 72 of the primary holographic optical waveguide 70, as illustrated in FIG. 8A. In such an arrangement, the object beam 62 is further incident on an exposure surface 82a on a first side of the second holographic recording medium 82 following transmission through the spherical shaped object mask 40. In this alternate embodiment, the reference beam 64 is directed through the auxiliary holographic optical waveguide 80 at an angle, through a second side of the second holographic recording medium 82 opposite to the first side, to enable total internal reflection of the reference beam 64 on an internal surface 82b on the first side of the second holographic recording medium 82. As a result, the object beam and the reference beam produce an interference pattern in the second holographic recording medium 82 in accordance with the pattern contained in the spherical shaped object mask 40, further as defined by the particular mask pattern 44.

In another alternate embodiment, the primary holographic optical waveguide 70a is further characterized by first and second cylindrical regions 90, 92 such as shown in FIG. 6. In this embodiment, the primary holographic optical waveguide 70a is conically tapered from the first cylindrical region 90 to the second cylindrical region 92. The first cylindrical region 90 enables total internal reflection of the reference beam 64 to the second cylindrical region 92. Furthermore, the second cylindrical region 92 includes the inner cylindrical cavity 72, for use similar to that as discussed herein with respect to the inner cylindrical cavity of the primary holographic optical waveguide of FIG. 4. FIG. 6A illustrates a 3-D isometric view of the primary holographic optical waveguide of FIG. 6.

With respect to the embodiments as discussed herein, the holographic recording medium may include a holographic emulsion. Holographic emulsion materials are known in the art and only briefly discussed herein. Alternatively, the holographic recording medium may include a suitable photo-refractive crystal, i.e., the photo-refractive crystal being suitable for recording a hologram.

In the above discussed embodiments, directing of the object beam 62 to the holographic recording medium (76, 82) following transmission through the spherical shaped object mask 40 further includes directing the object beam into an inner region of the spherical shaped object mask 40 (FIG. 3). The object beam 62 is directed using an optical coupling waveguide 50. In this manner, the object beam 62 radiates in an outward direction from a center region of the spherical shaped object mask 40, through the spherical shaped object mask. For example, see FIG. 4. Additionally, directing of the object beam 62 further includes randomly diffusing the object beam in the inner region of the spherical shaped object mask using random diffuser 48 (FIG. 3). The optical coupling waveguide 50 includes an optical fiber having a cross-section diameter, for example, on the order of one half to one quarter of the diameter of the spherical mask 40. Optional support member 52 is disposed along a length dimension of the optical fiber. In addition to providing support, the support member 52 further inhibits any extraneous light transmission.

In addition, either waveguide 50 and/or optional support means 52 (or other suitable support means) is provided for supporting the optical coupling waveguide 50 with respect to the spherical shaped object mask 40. In one instance, the support means 52 is provided for securing the optical coupling waveguide 50 to the spherical shaped object mask 40. Waveguide 50 or the support means 52 may also be used for locating the spherical shaped object mask 40 at a desired position along the central axis 74 of the primary holographic optical waveguide 70 within the cylindrical cavity 72 thereof during recording of the TIR holographic image of the spherical shaped object mask.

Figure 8B:
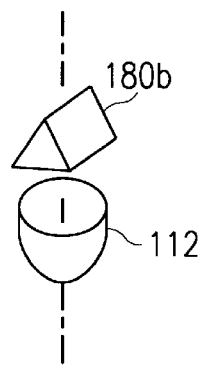

Referring now to FIG. 8, and the other FIGS. as needed, another alternate embodiment 110 will be discussed. According to the alternate embodiment 110, the method and apparatus for recording a total internal reflection hologram of a spherical shaped object mask in a holographic recording medium includes the following. As previously indicated, a coherent beam of light is provided from a suitable coherent light source. The coherent beam of light is further used for providing an object beam 62 and a reference beam 64. In the embodiment of FIG. 8, a primary holographic optical waveguide 180 is provided. In one instance, the primary holographic optical waveguide 180 is characterized by a conical shaped right angle prism 180A as shown in FIGS. 7 and 8A. In an alternate embodiment, primary waveguide 180 is characterized by a standard right angle prism 180B as shown in FIG. 8B. The right angle prism 180 includes a holographic recording medium 182 disposed upon and optically coupled to a base surface 184 thereof. The object beam 62 is directed to the holographic recording medium 182 so that the object beam is incident on an exposure surface on a first side of the holographic recording medium 182 following transmission through the spherical shaped object mask 40. Lastly, the reference beam 64 is directed through the primary holographic optical waveguide 180 at an angle to enable total internal reflection of the reference beam 64 on an internal surface on the first side of the holographic recording medium 182. As a result, the object beam and the reference beam produce an interference pattern in the holographic recording medium in accordance with a pattern contained in the spherical shaped object mask 40. Embodiment 110 enables capturing of spherical shaped mask information into a planar domain and the exposure of a spherical substrate from the spherical information stored in the planar domain.

With respect to the embodiment 110 of FIG. 8, a mirror 112 having a reflective surface is used to direct the object beam 62 in a prescribed manner. The mirror 112 is disposed for reflecting the object beam onto the holographic recording medium 182 of the primary holographic optical waveguide 180. The object beam is reflected onto the holographic recording medium 182 subsequent to transmission of the object beam 62 through the spherical object mask 40. Mirror 112 provides a necessary converging of light emanating from spherical object mask 40 and for capturing of light during an exposure onto the substantial surface area of spherical substrate 30. Also, as previously discussed, the holographic recording medium may include a holographic emulsion. Alternatively, the holographic recording medium may include a suitable photo-refractive crystal such as is suitable for the recording of a hologram. Mirror 112 is preferably an ellipsoidal mirror. The ellipsoidal mirror allows for light in the recording area to be highly concentrated. The recording area is generally the area where the spherical substrate will be positioned during an exposure with the holographic information. In an alternate embodiment, mirror 112 can include a parabolic mirror. The parabolic mirror provides an even intensity of light spread over the area of the holographic medium.

Referring now back to FIG. 5, in accordance with the yet another embodiment, a photolithograhic method and apparatus for exposure of a spherical shaped semiconductor substrate 30 according to a mask pattern 44 of a primary spherical object mask 40 in the manufacture of a spherical semiconductor device shall be discussed. In this embodiment, a secondary mask 77 containing spherical exposure information according to the spherical object mask is provided. That is, the secondary mask includes having stored therein a hologram recorded from the primary spherical object mask 40. The spherical shaped semiconductor substrate 30 is positioned with respect to the secondary mask 77 using suitable means, further in preparation for a photolithographic exposure in a manner similar to that with respect to the spherical object mask 40 and exposure of the holographic recording medium 76. Note that for the exposure of a spherical shaped semiconductor substrate, reference numeral 40 of FIG. 5 becomes reference numeral 30 (not shown). Suitable means for positioning spherical shaped semiconductor substrate 30 may include kinematic mounting or other means, as is known in the art. Lastly, a reference beam 64 is directed upon the secondary mask 77 in a prescribed manner for enabling inverse scattering of the hologram. The inverse scattering of the hologram thereby produces an inverse scattered holographic image photolithographic exposure of the spherical shaped semiconductor substrate 30, as indicated by the arrows 67 of FIG. 4.

As mentioned above, suitable means for positioning spherical substrate 30 may include kinematic mounting. Briefly, kinematic mounting of substrate 30 includes supporting the sphere by the surface shape itself. Substrate 30 is preferably supported in an area corresponding to a like area of the primary spherical mask 40 where waveguide 50 couples to the primary spherical mask 40. A kinematic mount may include, for example, three (3) spaced apart mounting spheres, each mounting sphere having a diameter on the order of much less than the diameter of spherical substrate 30 (e.g., <<1 mm). Kinematic mounting enables repeatable mounting, given that the volume space of the spherical substrates is kept substantially the same between one spherical substrate and the next. In other words, the spherical substrates preferably have uniform sphericity. In an alternate mounting arrangement, the three (3) mounting spheres could be substituted with three (3) non-destructive mounting points. That is, the mounting points are such that they do not cause damage to the spherical substrates being mounted thereto. With a kinematic mount, positioning of a substrate for an exposure can be performed with minimal difficulty, to include possible rotation as may be necessary to achieve a desired rotational (angular) position. As mentioned, with a kinematic mount, positioning is repeatable upon removal and replacement of spherical substrates.

In the photolithograhic method and apparatus for exposure of a spherical shaped semiconductor substrate as just described, the secondary spherical mask 77 is provided by the recording a total internal reflection hologram of the primary spherical shaped object mask 40 in a holographic recording medium 76. Recording the TIR hologram of the primary spherical object mask 40 (FIG. 5) includes providing a coherent beam of light 60 from a suitable coherent light source 59. The coherent beam of light 60 is used to further provide an object beam 62 and a reference beam 64. A primary holographic optical waveguide 70 is provided, further being characterized by an inner cylindrical cavity 72 disposed therein. The inner cylindrical cavity 72 is preferably concentric with a principal axis 74 of the primary holographic optical waveguide 70. The holographic recording medium 76 is disposed upon and/or optically coupled to the inner surface 78 of the cylindrical cavity 72. The object beam 62 is directed to the holographic recording medium 76 so that the object beam is incident on an exposure surface on a first side of the holographic recording medium 76 following transmission through the primary spherical shaped object mask 40. Lastly, the reference beam 64 is directed through the primary holographic optical waveguide 70 in a manner such that the reference beam 64 is disposed at an angle to enable total internal reflection of the reference beam on an internal surface on the first side of the holographic recording medium 76. As a result, the object beam 62 and the reference beam 64 produce an interference pattern in the holographic recording medium 76 in accordance with a pattern contained in the primary spherical shaped object mask 40.

In an alternate embodiment, in the photolithograhic method and apparatus for exposure of a spherical shaped semiconductor substrate 30 as described above, the secondary mask 183 (FIG. 8) may also be provided by recording a total internal reflection hologram of the primary spherical shaped object mask 40 in a holographic recording medium 182 as further discussed below. A coherent beam of light 60 is provided from a coherent light source 59, wherein the coherent beam of light is used further for providing an object beam and a reference beam 64. A primary holographic optical waveguide 180 is provided, the waveguide being characterized by a conical shaped right angle prism (FIG. 8A) or a standard right angle prism (FIG. 8B). The right angle prism includes a holographic recording medium 182 disposed upon and optically coupled to a base surface 184 thereof. The object beam 62 is directed to the holographic recording medium 182 in a manner so that the object beam is incident on an exposure surface on a first side of the holographic recording medium 182 following transmission through the spherical shaped object mask 40 (FIG. 8). Lastly, the reference beam 64 is directed through the primary holographic optical waveguide 180 at an angle to enable total internal reflection of the reference beam 64 on an internal surface on the first side of the holographic recording medium 182. As a result, the object beam 62 and the reference beam 64 produce an interference pattern in the holographic recording medium 182 in accordance with a pattern contained in the spherical shaped object mask 40.

Other alternate embodiments, as discussed herein above with respect to FIGS. 3, 4, 6 and 7, may also be implemented in the photolithograhic method and apparatus for exposure of a spherical shaped semiconductor substrate 30 in the semiconductor manufacturing process of spherical semiconductor integrated circuits and devices.

As used herein, emulsion refers to a holographic material, such as is available in liquid form and applied to a desired surface. The emulsion can be applied, for example, using a spun-on technique or other suitable technique known in the art. The emulsion is exposed to an interference pattern as discussed herein, further created using the coherent beam of light, for example, such as from a laser device.

As discussed, the present method and apparatus involves the use of a primary mask and a secondary mask. The primary mask is used for exposure and illumination of the secondary mask for creating the secondary mask. The secondary mask is used during photo-lithography exposure of a spherical shaped semiconductor substrate during a manufacturing process. In other words, the secondary mask is used in the production of spherical semiconductor integrated circuits and/or devices. One advantage of the embodiment of the present invention is that any number of secondary masks can be produced from a single primary mask. The present invention thus relates to and addresses the step of photolithography in the manufacture of spherical semiconductor integrated circuits and/or devices.

The reference beam and the object beam are coherent to achieve an interference pattern, that is, the path lengths of the beams are within the coherence length of the laser source. The laser beam source emits a light beam which is characterized by a coherence length. The emulsion layer is exposed to an interference pattern produced from a coherent laser beam which is being transmitted through a desired pattern or object that is to be recorded. The interference pattern includes phase and amplitude information. The interference pattern is recorded as a complex grating, also referred to as a hologram, in the emulsion material (i.e., the holographic recording layer).

The reference beam and the object beam are derived from the light source (e.g., a laser source) and each of the reference beam and the object beam are preferably coherent within the coherence length of the light source. Coherence length for a particular light source may include a wide range of lengths, for example, from fractions of a millimeter, four to five centimeters, fifteen centimeters, to fifteen meters, etc. With respect to the light source, if the light source has insufficient coherence length, then it may be problematic in achieving a desired interference pattern. That is, if at a given surface, the difference in path length of a reference beam and an object beam is greater than the coherence length of the light source, then an interference pattern cannot be achieved. It is the phase pattern which provides the necessary diffraction to recreate the particular mask pattern.

In creating the secondary mask, it is the object beam which contains data about the spherical object or spherical mask which the object beam has been transmitted through. During creation of the secondary mask, both reference and object beams are exposed simultaneously, and the path lengths of each beam are within the coherence length of the light source. An exposure is then made which contains information required to replicate or reproduce the given light pattern or image of the given mask.

After the holographic emulsion is exposed, it is then developed and fixed according to the particular requirements of the emulsion. The patterned emulsion (i.e., the secondary mask) can then be used for exposing a spherical semiconductor substrate by using a reference beam alone, as discussed herein:

Alternatively, instead of the emulsion, a photo-refractive crystal may be used for capturing a particular interference pattern information. The photorefractive crystal, once exposed, typically can be used right away, since it requires little or no developing and fixing as required in the instance of the emulsion. The photo-refractive crystal may however require fixing (thermally, electrically, or by other suitable methods known in the art), as may be necessary, so that upon exposure, the interference pattern information will not be undesirably lost. In addition, the photo-refractive crystal may include undoped lithium niobate ($LiNbO_3$), iron doped $LiNbO_3$, or $KH_2P_4$.

During photolithography exposure of a spherical semiconductor substrate, the reference beam is illuminated onto the patterned holographic recording medium (e.g., the exposed, fixed and developed emulsion or photo-refractive crystal). A pattern is then produced that portrays the conjugate of the primary mask object. A hologram (i.e., interference pattern) is then reconstructed with the use of the reference beam and the patterned holographic recording medium onto the spherical semiconductor substrate.

The holographic image is thus constructed as a three-dimensional (3-D) image. The 3-D image is essentially an inverse scattering of the light emanating from the object beam. While one example of a reflection holography set-up has been discussed herein, other set-ups are believed possible.

Looking at possible problems, consider a holographic set-up in which an object beam enters a holographic recording medium from one side and the reference beam enters the holographic recording medium from the opposite side. While a hologram can be recorded, a problem arises when re-illuminating the holographic recording medium with the reference beam. If the recording does not have one hundred percent (100%) diffraction efficiency, then there will occur leakage light which traverses straight through the holographic recording medium. This relates to a zero-order problem. The term zero-order is used to describe the straight order of the reference beam, that is, when there is no diffraction. While there are other orders of diffraction, the zero-order is allowed to partially leak through, for example, if the recording medium has only a seventy percent (70%) diffraction efficiency. Worse yet is a diffraction efficiency of thirty percent (30%) or less. It is desirable to minimize any unwanted noise light when trying to use the holographic system to expose something. Unwanted noise light smooths out an exposure and reduces contrast.

In the present embodiments, the reference beam is directed onto a surface of the right-angle prism of revolution so as to be incident at approximately forty-five degrees (45°) onto the surface which is in optical contact with the holographic recording medium. Light is incident at an angle greater than a total internal reflection angle, wherein the total internal reflection angle depends upon the refractive index of a particular transparent medium. If the angle of incidence is greater than the critical angle, then the light will totally internally reflect. No light is allowed to pass through the surface when the incident light is totally internally reflected.

In one embodiment, the emulsion is applied to have a given thickness, the given thickness to within the allowance of the critical angle, further to within a few degrees. It is also desired that the surface of the holographic recording medium be as smooth as possible, i.e., not rough. In another embodiment (FIG. 8), emulsion is applied to a surface of the right angle conical prism. Light travels through the conical prism, through the emulsion, reflects off of the internal surface of the emulsion and couples back into the conical prism. The light is thus totally internally reflected. Furthermore, the emulsion is characterized by a given index of refraction. The emulsion is selected such that its index of refraction is fairly similar to that of the conical prism, to avoid problems.

In operation, a reference beam travels through the conical prism, through the emulsion and is totally internally reflected and then exits the prism (FIGS. 7 and 8). At the same time, an object beam is directed through the spherical mask at the emulsion layer. Upon the object beam striking the mask, a diffraction effect is produced according to the particular grating pattern of the spherical mask. That is, the spherical mask is illuminated by the object beam and light emanates through the mask according to the particular grating pattern of the mask. As a result, pattern data information is recorded in the holographic recording medium. The pattern data information is information which is required upon re-illumination, with the reference beam alone, to inverse scatter back into the original mask shape in the form of an illumination pattern. However, the inverse scatter illumination pattern only exists at a prescribed critical spacing from the holographic recording medium (e.g., emulsion). The critical spacing between the holographic recording medium and the mask during recording is kept constant during an inverse scattering of the mask image onto a spherical semiconductor substrate.

Once the holographic recording medium is exposed, then the holographic recording medium can be used to create an inverse scattered illumination pattern. In this context, the inverse scattering of light is that light which is required to produce an exact image of where light was emanating from and/or through the transparent portion of the mask during initial exposure of the holographic recording medium with the object beam.

In the present embodiment, photolithography of a three-dimensional space, as opposed to a two-dimensional space, is accomplished. The present embodiment includes the use of a TIR holography method further with the use of a secondary mask exposure. The secondary mask exposure in one embodiment involves the use of a prism of revolution, more particularly, a right angle prism of revolution. The prism of revolution includes a cylindrical aperture disposed along a principal axis thereof. A reference beam is supplied in the form of a cone or ring, such as a conical shaped beam. Plane waves enter the prism of revolution as a rotation of reference beams, oriented at a right angle with respect to an input surface of the prism of revolution. Several ways are possible for producing the rotation of reference beams. One possibility includes using a diffractive optical element to provide the necessary beam manipulations. Another possibility includes the use of a conical mirror such as shown in FIG. 5 which illustrates exposure of the secondary mask.

In another embodiment, light is provided with the use of a light source and conical prism which allows light to be projected in the form of a ring of light. The reference beam is then in the shape of a surface of a cone. The reference beam is further in the form of a cone shaped beam having a given thickness of beam width. The cone shaped reference beam is used to expose the cylindrical shape of the secondary holographic mask (FIG. 6).

As previously discussed, in one embodiment, the inner cylindrical surface of the prism of revolution is coated with a desired holographic recording medium. The cone shaped reference beam enables creation of the secondary holographic mask, in conjunction with the primary mask. There is thus a system that includes a prism of revolution with an incoming reference beam, as a cone shaped beam.

With respect to the primary mask 40 of FIG. 3, one manner of making the primary mask is as follows. The primary mask is preferably on the order of a 1:1 ratio to a spherical semiconductor substrate yet to be subjected to a photolithographic step. Recall that the secondary mask is used during photolithography of the spherical semiconductor substrate. In the art, holography has typically been limited to a one-to-one ratio from an object into a hologram size that it actually is. The primary mask is thus preferably on the order of one-to-one of the size of the object that is to be illuminated (i.e., via subsequent exposure through use of the secondary mask). Furthermore, in addition to that discussed above, a reduction capability, for example, on the order of 50:1 would be useful.

In addition, the primary mask includes a high quality fused silica or glass sphere with a patterning layer thereon. The patterning layer may include a metalized layer of a given thickness. In one embodiment, the primary mask is written with desired pattern information with the use of e-beam writing machines. In the formation of the primary mask, the translation and rotation stages of the e-beam writing machine are accurately controlled to provide a desired movement during writing of the primary mask. Given a proper design, e.g., such as piezo electric movement, and having a rotational stage for providing rotational capability, including an actual mechanical movement as opposed to scanning the beam, an accuracy on the order of tens of nanometers may be obtained. As a result, diffraction and inverse scattering are useful for providing a desired imaging onto a spherical substrate, since conventional imaging objects are difficult to design for providing imaging onto the spherical substrate.

In one embodiment, formation of the patterned layer 44 on the primary object mask 40 may be accomplished by direct-writing onto the sphere using a light beam and high quality lens (e.g. a microscope objective or stepper lens) in conjunction with high precision rotational stages. Using a spot size on the order of the desired feature size, a desired pattern is written onto a photoresist coated spherical shaped core 42 of primary mask 40, mask 40 having a metal layer disposed between the photoresist and the core. Subsequent to the writing of the desired pattern, the photoresist is developed and exposed portions of the metal layer are etched away to achieve the desired pattern in the metal layer.

Still further, in another alternate embodiment, the primary metal mask 40 as shown in FIG. 3 may also include the following. The primary metal mask 40 can include a transparent sphere 42 with a blind hole 46 formed therein. The sphere 42 is preferably characterized by an accurate spherical outer surface thereof, having a similar dimension as that of the particular size spherical semiconductor substrate for which the lithography is planned. The blind hole 46 formed in the sphere 42 need not be smoothly ground on an inner surface thereof. Blind hole 46 is then filled with dissimilar optical index (i.e., dissimilar to the optical index of the sphere 42) random beads and/or powder to provide the function of a random diffuser 48. A suitable adhesive is then poured into the blind hole 46 to secure the random beads and/or powder within the blind hole. The adhesive further includes a given optical index, wherein the optical index matches that of the sphere used for the primary metal mask. The index-matching adhesive thus takes care of any unsmooth grinding on the inner surface of the mask. In addition, the random beads and/or powder of dissimilar index assist in producing an even illumination of light, as discussed herein. A light beam entrance of the newly-formed waveguide is then polished for providing coupling of input laser light. The primary metal mask is thus completed.

According to the method and apparatus of the present embodiments, photolithography is performed on a spherical substrate. In one embodiment, the spherical substrate is on the order of a one (1) millimeter diameter spherical substrate.

The present embodiments advantageously utilize holograms to store phase and amplitude information. In addition, a desired sizing may also be accomplished. A diffraction grating is composed of various prescribed slits such that with a certain wavelength of light, a particular diffraction pattern can be produced. The diffraction pattern is essentially the hologram. Assume, for example, that a hologram is recorded such that the holographic image that is produced is the shape of a circle. For varying the size of the circle, it is conceivable that since wavelength and grating spacing are related in terms of the angular frequencies emanating from a diffraction grating, then by changing wavelength, the holographic image can be scaled to a desired size. Still further, in lieu of and/or in combination with a change of wavelength, the size of the primary mask may be scaled as needed or desired.

In addition to the above, in the embodiments described, it is preferred that the light pattern emanate from the primary mask as uniformly as possible. It is also desired that the light pattern which is recorded by the holographic recording medium be recorded or captured as uniformly as possible. With respect to the secondary mask, if light emanating from the primary mask is non-uniformly captured, then during an exposure illumination back onto the spherical substrate surface, the spherical substrate surface will not be evenly exposed. It is desired that the uniformity of illumination be on the order of plus or minus two percent (+/−2%).

A uniform intensity pattern on an entire surface of the spherical shaped substrate is thus desired. During formation of the secondary mask, the extent to which the primary mask image is accurately captured will have an effect upon the re-creation of the primary mask image during an inverse scattering exposure through the secondary mask during photolithography of the spherical shaped semiconductor substrate. Holography refers to inverse scattering. Whatever is captured in the holographic recording material is whatever is going to be reproduced or inverse scattered back into the original object, in the present instance, the image of the primary mask.

According to the present method and apparatus, one method of uniformly capturing the primary mask pattern is to provide a holographic recording medium on the inner cylindrical surface of the prism of revolution. In an alternate embodiment, a holographic recording medium may be placed upon a surface of a conical shaped right angle prism, wherein the conical shaped right angle prism is used at one end of the inner cylindrical surface of the prism of revolution (FIG. 7A).

With respect to the present embodiments, as long as the entrance angle of the primary holographic waveguide is determined such that the total internal reflection critical angle is within the bounds of the reflection angle, then a light beam entering the waveguide will be kept inside the medium of the waveguide and not allowed to escape. That is, light couples into and out of input and output surfaces of the waveguide, but does not undesirably leak out of side surfaces. The waveguide includes any suitable medium transparent to a selected wavelength that can capture and/or guide light and keep zero order light from going through side surfaces thereof. Furthermore, the waveguide medium is used to capture a diffraction pattern and then for inverse scattering upon illumination with a reference beam.

The conical shaped right angle prism can be placed on top of the prism of revolution to facilitate capturing a greater amount of light emanating from the primary mask during exposure of the secondary mask (FIG. 7A). That is, more light emanating from various angles with respect to the cylindrical aperture of the prism of revolution can be captured. With the prism of revolution, some light may be lost at the ends of the cylindrical aperture.

During photolithography of a spherical substrate disposed within the chamber (i.e., inside the cylindrical cavity), the hologram diffracts light into the chamber and onto the spherical substrate which is disposed therein. Because some of the light is lost, there will result a corresponding loss of intensity on portions of the secondary mask. The illumination on the prism of revolution is consistent, that is, as consistent as the flat intensity across the illumination beam. Some information, however, may not be captured sufficiently at the ends of the cylindrical cavity. Another way of capturing the light with a slightly adjusted shape is thus illustrated in FIG. 8.

As discussed, it is important to capture the holographic information as uniformly as possible. In one instance, a conical shaped right angle prism is used in conjunction with the prism of revolution (FIG. 7A). In another instance, an alternate waveguide may be used (FIG. 8). In addition, it is also important that the intensity of light emanating from the primary mask 40 has a given intensity profile. That is, the radial intensity profile is preferably uniform and/or flat. If the radial intensity profile is not uniform or flat, then an appropriate amount of capture can be made by strategically locating the holographic recording medium such that the illumination pattern from the primary mask and the holographic recording medium coincide. It is desired to evenly balance out the illumination and the capture.

The primary metal mask 40 of FIG. 3 includes a base material shaped in the form of a sphere or ball. The base material is preferably transmissive to a given wavelength of light according to a particular lithographic application. For example, the base material may include plastic, glass, or any other suitable transmissive material. The spherical material further includes a blind hole 72 formed therein. A powder, microspheres, or suitable light diffusing medium 48 (or filament) is placed into the blind hole. Furthermore, a tube or support means 52 can be provided.

The light diffusing medium 48 of FIG. 3 is used to create a waveguide, for example, of diffusing powder, that has an index of refraction different from a surrounding index matching fluid. The index matching fluid has an index of refraction which is similar to the index of refraction of the primary mask spherical base material. In other words, the base material and the tubular waveguide have the same index of refraction, whereas the powder has a different index of refraction.

The primary mask 40 thus preferably includes a random diffuser 48. With a given combination of powder size (i.e., particle size of the powder) and a given difference in index of refraction, a desired random diffused light can be produced. The difference in the index of refraction is generally enough to produce desired refractions and reflections, which further yields a very uniform spherical illumination in an outward radial direction.

In the making of primary mask 40 of FIG. 3, beginning with a sphere 42 (e.g., bead) having a blind hole 46 therein, the blind hole is filled with an appropriate diffusing powder and formed into a random diffusing waveguide. The unit is then tested to ensure that a desired uniform intensity pattern can be obtained according to a particular illumination polar plot. The illumination polar plot is a plot of measured illumination intensity per angle emanating from a center of the sphere. From the center of the sphere, a plot is made of measured intensity per angle. The plot is constructed using a suitable detector disposed in three-space for measuring the intensity of illumination that is projected from the sphere, substantially about the perimeter thereof. It is desired that the illumination intensity be as even as possible at a given radial distance from the primary metal mask 40.

It is thus desirable to verify the illumination intensity to determine that it is uniform to within a desired accuracy to enable an inverse scatter back of a desired image and for capturing the image with the holographic recording medium with a prescribed uniformity. In this manner, there is a certain level of assurance that a desired uniform illumination can be obtained from the primary mask prior to application of the metal layer to the underlying spherical shaped transparent material of the primary mask. That is, when the primary metal mask is illuminated with coherent light in order to produce the exposure of the holographic recording medium, the illumination emanating from the primary metal mask will be of highly uniform intensity.

Subsequent to a verification of the desired illumination, the sphere to be used in the making of the primary spherical mask is then coated with a desired mask coating using an appropriate deposition technique. For example, the mask coating may include a metal such as chrome, wherein the chrome is deposited using a vapor deposition process. The mask coating is then etched and/or inscribed with a desired pattern as previously discussed. Alternatively, the primary metal mask can be metalized, resist coated with a suitable photoresist, written and etched with a desired pattern, for example, using conventional deposition, photoresist, and etch technologies known in the art.

Surface sphericity and smoothness of the substrates and primary masks preferably have an accuracy in fractions of wavelengths (e.g., submicron dimensions).

As discussed herein, a primary metal mask is placed into the TIR lithography system and a reference beam and an object beam are used. The object beam is directed through the primary metal mask. Preferably, the primary metal mask is a three-dimensional spherical metal mask having a one to one size ratio with respect to the spherical substrates yet to be processed. In use, the primary metal mask is positioned within the inner cylindrical aperture of the prism of revolution (or alternate primary holographic optical waveguide). The object beam is provided to the primary metal mask such that it emanates in an outward direction from the primary metal mask onto the holographic recording medium. The reference beam is directed towards the prism of revolution. A desired interference pattern is then produced in the holographic recording medium, thus providing the necessary exposure required for making the secondary mask. The secondary mask is then developed and fixed in accordance with the particulars of the holographic recording medium being used. The developed and fixed secondary mask is then ready for use in exposing spherical semiconductor substrates according to the desired spherical mask pattern, as obtained from the primary metal mask.

Illuminating the secondary mask with only the reference beam provides inverse scattering from the holographic recording. The inverse scattering produces an image similar to that which emanated from apertures that existed in the spherical mask pattern on the surface of the metalized primary mask.

With respect to holographic emulsions, the same may be subject to some amount of shrinkage during developing, depending upon how stable a particular emulsion is. Shrinkage of an emulsion is also a function of any shrinkage of the material it is disposed upon. Significant shrinkage will cause undesired distortion of diffraction inverse scattering or of the hologram of the light imaged. It is thus preferable to use holographic emulsions having a desired stability. In addition, with respect to the emulsion, the emulsion is selected to provide a desired resolution. Resolution is a function of grain size. With an insufficient grain size, some information may be lost due to some chopping off of data in the emulsion holography, where the holography contained high spatial frequency content. In other words, if the emulsion grain size is not small enough to capture high spatial frequency information, then the information which is not captured is lost. Thus, the emulsion is needed to provide a desired resolution for a particular holographic operation. Resolution, for example, may include 2500 lines per millimeter, 5000 lines per millimeter, or much more. The required resolution depends upon the size of the hologram mask, the size of the object, and the distance between them. Also, as previously discussed, the holographic recording medium may also include holographic recording crystals for storing holographic information.

The method and apparatus of the present disclosure thus includes a lithography method apparatus or setup which uses total-internal-reflection (TIR) holography, further with respect to producing a primary mask and for providing a prescribed exposure of a 3-dimensional substrate surface. In particular, the present embodiments are applicable for use with a spherical shaped substrate or element. In addition, the present embodiments are also applicable for exposure of a cylindrical substrate or element with use of a corresponding shaped primary metal mask.

The present embodiments as disclosed herein enable an accuracy of the optical system for lithography on a spherical substrate to be less stringent. Unknown errors in the optical system are automatically accounted for. The present embodiments also lightens the weight of the optical system needed for lithography on the spherical substrates. The present embodiments further allow for submicron resolution, which will further improve, for example, as e-beam writing improves in resolution. Lastly, zero-order light is not present in the object chamber (e.g., cylindrical cavity) unless coupled by a diffraction grating produced by the hologram surface.

The present embodiments furthermore advantageously provide a total internal reflection lithography method and apparatus for use in 3-dimensional lithography of spherical substrates. The present embodiments utilize uniform illumination during the exposing step for producing the secondary holographic mask. The use of uniform illumination is critical and important for obtaining a desired secondary holographic mask, as explained herein.

While the invention has been particularly shown and described with reference to the preferred embodiment thereof, it will be understood by those skilled in the art that various changes in form and detail may be made therein without departing form the spirit and scope of the invention, as set forth in the following claims.

What is claimed is:

1. A method for recording a total internal reflection hologram of a spherical shaped object mask in a holographic recording medium, said method comprising the steps of:

providing a coherent beam of light, the coherent beam of light further for providing an object beam and a reference beam;

providing a primary holographic optical waveguide characterized by an inner cylindrical cavity disposed therein, the inner cylindrical cavity being concentric with a principal axis of the primary holographic optical waveguide, wherein the holographic recording medium is optically coupled to the inner surface of the cylindrical cavity;

directing the object beam to the holographic recording medium so that the object beam is incident on an exposure surface on a first side of the holographic recording medium following transmission through the spherical shaped object mask; and directing the reference beam through the primary holographic optical waveguide at an angle to enable total internal reflection of the reference beam on an internal surface on the first side of the holographic recording medium, wherein the object beam and the reference beam produce an interference pattern in the holographic recording medium in accordance with a spherical mask pattern contained in the spherical shaped object mask.

2. The method of claim 1, wherein the primary holographic optical waveguide includes a prism of revolution.

3. The method of claim 2, further comprising the steps of:

providing an auxiliary holographic optical waveguide in the form of a conical shaped prism, the conical shaped prism having a second holographic recording medium optically coupled to a base surface thereof;

positioning the auxiliary holographic optical waveguide with respect to the primary holographic optical waveguide such that the second holographic recording medium is disposed at one end of the cylindrical cavity of the primary holographic optical waveguide, wherein the object beam is further incident on an exposure surface on a first side of the second holographic recording medium following transmission through the spherical shaped object mask; and directing the reference beam through the auxiliary holographic optical waveguide at an angle, through a second side of the second holographic recording medium opposite to the first side, to enable total internal reflection of the reference beam on an internal surface on the first side of the second holographic recording medium, wherein the object beam and the reference beam produce an interference pattern in the second holographic recording medium in accordance with the pattern contained in the spherical shaped object mask.

4. The method of claim 1, wherein the primary holographic optical waveguide is further characterized by first and second cylindrical regions, wherein the primary holographic optical waveguide is conically tapered from the first cylindrical region to the second cylindrical region, the first cylindrical region enabling total internal reflection of the reference beam to the second cylindrical region, further wherein the second cylindrical region includes the inner cylindrical cavity.

5. The method of claim 1, wherein the holographic recording medium includes one of the following selected from the group consisting of a holographic emulsion and a photo-refractive crystal.

6. The method of claim 1, wherein the step of directing the object beam to the holographic recording medium following transmission through the spherical shaped object mask further includes directing the object beam into an inner region of the spherical shaped object mask using an optical coupling waveguide, further wherein the object beam radiates in an outward direction through the spherical shaped object mask.

7. The method of claim 6, further including randomly diffusing the object beam in the inner region of the spherical shaped object mask.

8. The method of claim 6, wherein the optical coupling waveguide includes an optical fiber.

9. The method of claim 6, wherein the optical coupling waveguide further includes a support member disposed along a length dimension of the optical fiber.

10. The method of claim 6, further including the step of supporting the optical coupling waveguide with respect to the spherical shaped object mask and securing the optical coupling waveguide to the spherical shaped object mask.

11. The method of claim 10, further including the step of locating the spherical shaped object mask at a desired position along the central axis of the primary holographic optical waveguide within the cylindrical cavity thereof.

12. A method for recording a total internal reflection hologram of a spherical shaped object mask in a holographic recording medium, said method comprising the steps of:

providing a coherent beam of light, the coherent beam of light further for providing an object beam and a reference beam;

providing a primary holographic optical waveguide characterized by a right angle prism, the right angle prism having the holographic recording medium optically coupled to a base surface thereof;

directing the object beam to the holographic recording medium so that the object beam is incident on an exposure surface on a first side of the holographic recording medium following transmission through the spherical shaped object mask; and directing the reference beam through the primary holographic optical waveguide at an angle to enable total internal reflection of the reference beam on an internal surface on the first side of the holographic recording medium, wherein the object beam and the reference beam produce an interference pattern in the holographic recording medium in accordance with a spherical mask pattern contained in the spherical shaped object mask.

13. The method of claim 12, wherein the right angle prism includes one selected from the following consisting of a standard right angle prism and a conical shaped prism.

14. The method of claim 12, wherein the step of directing the object beam includes providing a mirror having a reflective surface disposed for reflecting the object beam onto the holographic recording medium subsequent to transmission of the object beam through the spherical object mask.

15. The method of claim 14, wherein the mirror includes one selected from the group consisting of a parabolic mirror and an ellipsoidal mirror.

16. The method of claim 12, wherein the holographic recording medium includes one of the following selected from the group consisting of a holographic emulsion and a photo-refractive crystal.

17. The method of claim 12, wherein the step of directing the object beam to the holographic recording medium following transmission through the spherical shaped object mask further includes directing the object beam into an inner region of the spherical shaped object mask using an optical coupling waveguide, further wherein the object beam radiates in an outward direction through the spherical shaped object mask.

18. The method of claim 17, further including randomly diffusing the object beam in the inner region of the spherical shaped object mask.

19. The method of claim 17, wherein the optical coupling waveguide includes an optical fiber.

20. The method of claim 19, wherein the optical coupling waveguide further includes a support member disposed along a length dimension of the optical fiber.

21. The method of claim 17, further including the step of supporting the optical coupling waveguide with respect to the spherical shaped object mask and securing the optical coupling waveguide to the spherical shaped object mask.

22. The method of claim 21, further including the step of locating the spherical shaped object mask at a desired position with respect to the primary holographic optical waveguide.

23. A photolithograhic method for exposure of a spherical shaped semiconductor substrate according to a mask pattern of a primary spherical object mask in the manufacture of a spherical semiconductor device, said method comprising the steps of:

providing a secondary mask, the secondary mask having stored therein a hologram recorded from the primary spherical object mask and containing spherical mask pattern information;

positioning the spherical shaped semiconductor substrate with respect to the secondary mask in preparation for a photolithographic exposure; and directing a reference beam upon the secondary mask for enabling inverse scattering of the hologram to produce an inverse scattered holographic image photolithographic exposure of the spherical shaped semiconductor substrate.

24. The method of claim 23, wherein providing the secondary mask includes recording a total internal reflection hologram of the primary spherical shaped object mask in a holographic recording medium, including the steps of:

providing a coherent beam of light, the coherent beam of light further for providing an object beam and a reference beam;

providing a primary holographic optical waveguide characterized by an inner cylindrical cavity disposed therein, the inner cylindrical cavity being concentric with a principal axis of the primary holographic optical waveguide, wherein the holographic recording medium is optically coupled to the inner surface of the cylindrical cavity;

directing the object beam to the holographic recording medium so that the object beam is incident on an exposure surface on a first side of the holographic recording medium following transmission through the primary spherical shaped object mask; and directing the reference beam through the primary holographic optical waveguide at an angle to enable total internal reflection of the reference beam on an internal surface on the first side of the holographic recording medium, wherein the object beam and the reference beam produce an interference pattern in the holographic recording medium in accordance with the spherical mask pattern contained in the primary spherical shaped object mask.

25. The method of claim 23, wherein providing the secondary mask includes recording a total internal reflection hologram of the primary spherical shaped object mask in a holographic recording medium, including the steps of:

providing a coherent beam of light, the coherent beam of light further for providing an object beam and a reference beam;

providing a primary holographic optical waveguide characterized by a right angle prism, the right angle prism having the holographic recording medium optically coupled to a base surface thereof;

directing the object beam to the holographic recording medium so that the object beam is incident on an exposure surface on a first side of the holographic recording medium following transmission through the spherical shaped object mask; and directing the reference beam through the primary holographic optical waveguide at an angle to enable total internal reflection of the reference beam on an internal surface on the first side of the holographic recording medium, wherein the object beam and the reference beam produce an interference pattern in the holographic recording medium in accordance with a spherical mask pattern contained in the spherical shaped object mask.

26. An apparatus for recording a total internal reflection hologram of a spherical shaped object mask in a holographic recording medium, said apparatus comprising:

means for providing a coherent beam of light, the coherent beam of light further for providing an object beam and a reference beam;

a primary holographic optical waveguide characterized by an inner cylindrical cavity disposed therein, the inner cylindrical cavity being concentric with a principal axis of said primary holographic optical waveguide, wherein the holographic recording medium is optically coupled to the inner surface of the cylindrical cavity;

means for directing the object beam to the holographic recording medium so that the object beam is incident on an exposure surface on a first side of the holographic recording medium following transmission through the spherical shaped object mask; and means for directing the reference beam through said primary holographic optical waveguide at an angle to enable total internal reflection of the reference beam on an internal surface on the first side of the holographic recording medium, wherein the object beam and the reference beam produce an interference pattern in the holographic recording medium in accordance with a spherical mask pattern contained in the spherical shaped object mask.

27. The apparatus of claim 26, wherein said primary holographic optical waveguide includes a prism of revolution.

28. The apparatus of claim 27, further comprising:

an auxiliary holographic optical waveguide in the form of a conical shaped prism, the conical shaped prism having a second holographic recording medium optically coupled to a base surface thereof;

means for positioning said auxiliary holographic optical waveguide with respect to said primary holographic optical waveguide such that the second holographic recording medium is disposed at one end of the cylindrical cavity of said primary holographic optical waveguide, wherein the object beam is further incident on an exposure surface on a first side of the second holographic recording medium following transmission through the spherical shaped object mask; and means for directing the reference beam through the auxiliary holographic optical waveguide at an angle, through a second side of the second holographic recording medium opposite to the first side, to enable total internal reflection of the reference beam on an internal surface on the first side of the second holographic recording medium, wherein the object beam and the reference beam produce an interference pattern in the second holographic recording medium in accordance with the pattern contained in the spherical shaped object mask.

29. The apparatus of claim 26, wherein said primary holographic optical waveguide is further characterized by first and second cylindrical regions, wherein said primary holographic optical waveguide is conically tapered from the first cylindrical region to the second cylindrical region, the first cylindrical region enabling total internal reflection of the reference beam to the second cylindrical region, further wherein the second cylindrical region includes the inner cylindrical cavity.

30. The apparatus of claim 26, wherein the holographic recording medium includes one of the following selected from the group consisting of a holographic emulsion and a photo-refractive crystal.

31. The apparatus of claim 26, wherein said means for directing the object beam to the holographic recording medium following transmission through the spherical shaped object mask further includes means for directing the object beam into an inner region of the spherical shaped object mask using an optical coupling waveguide, further wherein the object beam radiates in an outward direction through the spherical shaped object mask.

32. The apparatus of claim 31, further including means for randomly diffusing the object beam in the inner region of the spherical shaped object mask.

33. The apparatus of claim 31, wherein the optical coupling waveguide includes an optical fiber.

34. The apparatus of claim 31, wherein the optical coupling waveguide further includes a support member disposed along a length dimension of the optical fiber.

35. The apparatus of claim 31, further including means for supporting the optical coupling waveguide with respect to the spherical shaped object mask and securing the optical coupling waveguide to the spherical shaped object mask.

36. The apparatus of claim 35, further including means for locating the spherical shaped object mask at a desired position along the central axis of said primary holographic optical waveguide within the cylindrical cavity thereof.

37. An apparatus for recording a total internal reflection hologram of a spherical shaped object mask in a holographic recording medium, said apparatus comprising:

means for providing a coherent beam of light, the coherent beam of light further for providing an object beam and a reference beam;

a primary holographic optical waveguide characterized by a right angle prism, the right angle prism having the holographic recording medium optically coupled to a base surface thereof;

means for directing the object beam to the holographic recording medium so that the object beam is incident on an exposure surface on a first side of the holographic recording medium following transmission through the spherical shaped object mask; and means for directing the reference beam through the primary holographic optical waveguide at an angle to enable total internal reflection of the reference beam on an internal surface on the first side of the holographic recording medium, wherein the object beam and the reference beam produce an interference pattern in the holographic recording medium in accordance with a spherical mask pattern contained in the spherical shaped object mask.

38. The apparatus of claim 37, wherein the right angle prism includes one selected from the following consisting of a standard right angle prism and a conical shaped prism.

39. The apparatus of claim 37, wherein said means for directing the object beam includes a mirror having a reflective surface disposed for reflecting the object beam onto the holographic recording medium subsequent to transmission of the object beam through the spherical object mask.

40. The apparatus of claim 39, wherein the mirror includes one selected from the group consisting of a parabolic mirror and an ellipsoidal mirror.

41. The apparatus of claim 37, wherein the holographic recording medium includes one of the following selected from the group consisting of a holographic emulsion and a photo-refractive crystal.

42. The apparatus of claim 37, wherein said means for directing the object beam to the holographic recording medium following transmission through the spherical shaped object mask further includes means for directing the object beam into an inner region of the spherical shaped object mask using an optical coupling waveguide, further wherein the object beam radiates in an outward direction through the spherical shaped object mask.

43. The apparatus of claim 42, further including means for randomly diffusing the object beam in the inner region of the spherical shaped object mask.

44. The apparatus of claim 42, wherein the optical coupling waveguide includes an optical fiber.

45. The apparatus of claim 44, wherein the optical coupling waveguide further includes a support member disposed along a length dimension of the optical fiber.

46. The apparatus of claim 42, further including means for supporting the optical coupling waveguide with respect to the spherical shaped object mask and securing the optical coupling waveguide to the spherical shaped object mask.

47. The apparatus of claim 46, further including means for locating the spherical shaped object mask at a desired position with respect to the primary holographic optical waveguide.

48. A photolithograhic apparatus for exposure of a spherical shaped semiconductor substrate according to a mask pattern of a primary spherical object mask in the manufacture of a spherical semiconductor device, said apparatus comprising:

a secondary mask, the secondary mask having stored therein a hologram recorded from the primary spherical object mask and containing spherical mask pattern information;

means for positioning the spherical shaped semiconductor substrate with respect to said secondary mask in preparation for a photolithographic exposure; and means for directing a reference beam upon the secondary mask for enabling inverse scattering of the hologram to produce an inverse scattered holographic image photolithographic exposure of the spherical shaped semiconductor substrate.

49. The apparatus of claim 48, wherein said secondary mask includes a total internal reflection hologram, the total internal reflection hologram being recorded by a device including:

means for providing a coherent beam of light, the coherent beam of light further for providing an object beam and a reference beam;

a primary holographic optical waveguide characterized by an inner cylindrical cavity disposed therein, the inner cylindrical cavity being concentric with a principal axis of the primary holographic optical waveguide, wherein the holographic recording medium is optically coupled to the inner surface of the cylindrical cavity;

means for directing the object beam to the holographic recording medium so that the object beam is incident on an exposure surface on a first side of the holographic recording medium following transmission through the primary spherical shaped object mask; and means for directing the reference beam through the primary holographic optical waveguide at an angle to enable total internal reflection of the reference beam on an internal surface on the first side of the holographic recording medium, wherein the object beam and the reference beam produce an interference pattern in the holographic recording medium in accordance with the spherical mask pattern contained in the primary spherical shaped object mask.

50. The apparatus of claim 48, wherein the secondary mask includes a total internal reflection hologram, the total internal reflection hologram being recorded by a device including:

means for providing a coherent beam of light, the coherent beam of light further for providing an object beam and a reference beam;

a primary holographic optical waveguide characterized by a right angle prism, the right angle prism having the holographic recording medium optically coupled to a base surface thereof;

means for directing the object beam to the holographic recording medium so that the object beam is incident on an exposure surface on a first side of the holographic recording medium following transmission through the spherical shaped object mask; and means for directing the reference beam through the primary holographic optical waveguide at an angle to enable total internal reflection of the reference beam on an internal surface on the first side of the holographic recording medium, wherein the object beam and the reference beam produce an interference pattern in the holographic recording medium in accordance with a spherical mask pattern contained in the spherical shaped object mask.

* * * * *